United States Patent [19]
Mogami et al.

[11] Patent Number: 5,929,504
[45] Date of Patent: Jul. 27, 1999

[54] SEMICONDUCTOR DEVICE WITH TRENCH ISOLATION STRUCTURE AND FABRICATION METHOD THEREOF

[75] Inventors: Toru Mogami; Takashi Ogura, both of Tokyo, Japan

[73] Assignee: NEC Corporation, Tokyo, Japan

[21] Appl. No.: 09/097,664

[22] Filed: Jun. 16, 1998

[30] Foreign Application Priority Data

Jun. 16, 1997 [JP] Japan .................................. 9-158791

[51] Int. Cl.⁶ ............................................. H01L 29/00
[52] U.S. Cl. ........................... 257/510; 257/513; 257/640
[58] Field of Search ................................. 257/510, 514, 257/513, 64

[56] References Cited

U.S. PATENT DOCUMENTS

| | | | |
|---|---|---|---|
| 4,471,525 | 9/1984 | Sasaki | 257/510 |
| 4,863,562 | 9/1989 | Bryant et al. | 156/649 |
| 5,358,891 | 10/1994 | Tsang et al. | 437/67 |
| 5,567,635 | 10/1996 | Acovic et al. | 437/43 |
| 5,661,072 | 8/1997 | Jeng | 438/439 |
| 5,742,095 | 4/1998 | Bryant et al. | 257/647 |
| 5,770,484 | 6/1998 | Kleinhenz | 438/155 |
| 5,822,425 | 9/1998 | Yindeepol et al. | 437/62 |

FOREIGN PATENT DOCUMENTS

| | | |
|---|---|---|
| 0 0722 966 | 3/1983 | European Pat. Off. . |
| 1-186645 | 7/1989 | Japan . |
| 3-173174 | 7/1991 | Japan . |
| 4-27141 | 1/1992 | Japan . |
| 5-3246 | 1/1993 | Japan . |
| 5-299497 | 11/1993 | Japan . |
| 2314682 | 1/1998 | United Kingdom . |

*Primary Examiner*—Sara Crane
*Attorney, Agent, or Firm*—Sughrue, Mion, Zinn, Macpeak & Seas, PLLC

[57] ABSTRACT

A semiconductor device with the trench isolation structure is provided, in which the leakage current problem does not occur. This device is comprised of a semiconductor substrate, an isolation trench formed in a surface region of the substrate and filled with first and second isolation dielectrics, an interlayer dielectric layer formed on the surface region of the substrate to cover the isolation trench, and a conductive layer formed on the interlayer dielectric layer to be overlapped with the isolation trench. The interlayer dielectric layer has a contact hole located near the isolation trench. The contact hole is formed by etching. The conductive layer is contacted with and electrically connected to a region of the substrate through the contact hole of the interlayer dielectric layer. The first isolation dielectric serves as a primary insulator. The second isolation dielectric serves as a secondary insulator. The first isolation dielectric has a pair of depressions, each having one side contiguous with one of the pair of top corners of the isolation trench. The pair of depressions of the first isolation dielectric are filled with the second isolation dielectric. The second dielectric is lower in etch rate than that of the first dielectric in the process for forming the contact hole.

5 Claims, 8 Drawing Sheets

SEMICONDUCTOR DEVICE WITH TRENCH ISOLATION STRUCTURE AND FABRICATION METHOD THEREOF

BACKGROUND OF THE INVENTION

1. Field of the Invention

The present invention relates to a semiconductor device and more particularly, to a semiconductor device with the trench isolation structure and a fabrication method thereof.

2. Description of the Prior Art

The isolation structure is essential for Integrated Circuits (ICs) to electrically isolate electronic elements or devices on a semiconductor substrate. To implement the isolation structure, conventionally, two isolation techniques have been used.

In a first one of the isolation techniques, the isolation dielectric is formed on a main surface of the semiconductor substrate by the well-known LOcal Oxidation of Silicon (LOCOS) method. The isolation dielectric is typically made of a thick silicon dioxide ($SiO_2$) layer having a pattern of a wanted isolation region.

In a second one of the isolation techniques, the isolation dielectric is formed to fill a trench formed in a surface region of the semiconductor substrate. The trench has a pattern of a wanted isolation region and is filled with the isolation dielectric, thereby constituting the trench isolation structure. The isolation dielectric is typically made of $SiO_2$.

A conventional semiconductor device including the trench isolation structure is shown in FIG. 1.

In FIG. 1, an isolation trench 102 is formed in a surface region of a single-crystal silicon substrate 101. The trench 102 is filled with an isolation dielectric 103. As the isolation dielectric 103, $SiO_2$ is usually used.

A diffusion region 111, which is opposite in conductivity type to the substrate 101, is formed in the surface region of the substrate 101. The end of the diffusion region 111 is contacted with the opposing edge of the isolation dielectric 103.

An interlayer insulating layer 110 is formed on the surface region of the substrate 101 to cover the diffusion region 111 and the isolation dielectric 103. The interlayer insulating layer 110 has a contact hole 114' uncovering the diffusion region 111.

A metallic wiring layer 109 is formed on the interlayer insulating layer 110 to overlap with the diffusion region 111 and the isolation trench 102. The wiring layer 109 is contacted with and electrically connected to the underlying diffusion region 111 through the contact hole 114' of the interlayer insulating layer 110.

The position of the contact hole 114' is designed so that the contact hole 114' uncovers the diffusion region 111 alone, in other words, the contact hole 114' is not contacted with the isolation dielectric 103. The designed, correct position of the contact hole 114' is indicated by a reference numeral 114 in FIG. 1.

When the position of the contact hole 114' deviates from its correct position 114 due to the positional and/or dimensional fluctuation in the fabrication process sequence, the wiring layer 109 on the interlayer insulating layer 110 tends to be contacted with the substrate 101 at a contact area 112 through the contact hole 114' of the interlayer insulating layer 110 and an opening 115 of the isolation dielectric 103, as shown in FIG. 1. This is caused by the fact that the isolation trench 102 and therefore the isolation dielectric 103 has vertical walls, which is unlike the isolation structure using the LOCOS method.

Thus, there is a problem that a leakage current flows between the wiring layer 109 and the substrate 101 due to the positional error of the contact hole 114'.

FIG. 2 shows another cause of the leakage current between the wiring layer 109 and the substrate 101. For simplification of description, the same reference numerals as those in FIG. 1 are attached to the same elements in FIG. 2, and the interlayer dielectric layer 110 and the metallic wiring layer 109 are omitted.

In FIG. 2, the isolation dielectric 103 filling the isolation trench 102 is made of a material with a large stress such as silicon nitride ($Si_3N_4$). Crystal defect regions 113 tend to be generated at the interface of the isolation dielectric 103 with the substrate 101 and the diffusion region 111 after heat treatment. The crystal defect regions 113 will cause the above-described leakage current problem between the diffusion region 111 and the substrate 101.

The other, relating conventional trench isolation structures are disclosed in the Japanese Non-Examined Patent Publication Nos. 4-27141 published in 1992 and 5-299497 published in 1993.

SUMMARY OF THE INVENTION

Accordingly, an object of the present invention is to provide a semiconductor device with the trench isolation structure in which the above-described leakage current problem does not occur.

Another object of the present invention is to provide a fabrication method of a semiconductor device with the trench isolation structure in which the above-described leakage current problem does not occur.

The above objects together with others not specifically mentioned will become clear to those skilled in the art from the following description.

According to a first aspect of the present invention, a semiconductor device is provided, which is comprised of a semiconductor substrate, an isolation trench formed in a surface region of the substrate and filled with first and second isolation dielectrics, an interlayer dielectric layer formed on the surface region of the substrate to cover the isolation trench, and a conductive layer formed on the interlayer dielectric layer to be overlapped with the isolation trench.

The interlayer dielectric layer has a contact hole located near the isolation trench. The contact hole is formed by an etching process.

The conductive layer is contacted with and electrically connected to a region of the substrate through the contact hole of the interlayer dielectric layer.

The first isolation dielectric serves as a primary insulator. The second isolation dielectric serves as a secondary insulator.

The first isolation dielectric has a pair of depressions. Each depression has one side contiguous with one of a pair of top corners of the isolation trench. The pair of depressions of the first isolation dielectric are filled with the second isolation dielectric.

The second dielectric has a lower etch rate in the etching process for forming the contact hole than that of the interlayer dielectric layer.

With the semiconductor device according to the first aspect of the present invention, the isolation trench formed in the surface region of the substrate is filled with the first and second isolation dielectrics, where the first isolation dielectric serves as a primary insulator, and the second isolation dielectric serves as a secondary insulator.

Also, the pair of depressions of the first isolation dielectric, each having one side contiguous with one of the pair of top corners of the isolation trench, are filled with the second isolation dielectric.

Therefore, when the position of the contact hole of the interlayer dielectric layer deviates from its correct position and the contact hole is overlapped with the isolation trench, the etching action is applied to the second dielectric in the isolation trench during the etching process for forming the contact hole of the interlayer dielectric layer.

Because the second dielectric has a lower etch rate in the etching process for forming the contact hole of the interlayer dielectric layer than that of the interlayer dielectric layer, the second dielectric is difficult to be etched.

Thus, the above-described leakage current problem due to etching is prevented from occurring.

Additionally, the isolation trench is filled with the first isolation dielectric serving as a primary insulator and the second isolation dielectric serving as a secondary insulator. Therefore, if a dielectric (e.g., $SiN_x$) having a large stress is used as the second isolation dielectric and at the same time, a dielectric (e.g., $SiO_2$) having a low stress is used as the first isolation dielectric, no crystal defect is generated at the contact area of the dielectric having a large stress with the substrate even after heat treatment.

As a result, the above-described leakage current problem due to crystal defect is prevented from occurring.

In a preferred embodiment of the semiconductor device according to the first aspect, the first isolation dielectric is made of silicon dioxide and the second isolation dielectric is made of silicon nitride.

In this case, the advantage of the present invention is effectively brought out.

In another preferred embodiment of the semiconductor device according to the first aspect, the first isolation dielectric includes a buried semiconductor. The buried semiconductor is not exposed from the first isolation dielectric.

In this case, there is an additional advantage that the stress of the first isolation dielectric is decreased compared with the case where the buried semiconductor is not formed, thereby decreasing the danger of the crystal defect regions after heat treatment.

As the buried semiconductor, silicon is preferably used.

In still another preferred embodiment of the semiconductor device according to the first aspect, the first isolation dielectric is made of a same material as the interlayer dielectric layer.

In this case, the advantage of the present invention is effectively brought out.

According to a second aspect of the present invention, a fabrication method of the semiconductor device according to the first aspect is provided, which is comprised of the following steps (a) to (l):

(a) A first dielectric layer is formed on a surface region of a semiconductor substrate.
(b) A second dielectric layer is formed on the first dielectric layer.
(c) An isolation trench is formed in the surface region of the substrate through said first and second dielectric layers.
(d) A third dielectric layer is formed on the second dielectric layer to cover the isolation trench. The isolation trench is entirely filled with the third dielectric layer thus formed.
(e) The third dielectric layer is planarized until the underlying second dielectric layer is exposed. The isolation trench is entirely filled with the remaining third dielectric layer.
(f) The third dielectric layer is removed without removing the second dielectric layer and the remaining third dielectric layer.
(g) The second dielectric layer is removed to expose the surface region of the substrate while a pair of depressions of the remaining third dielectric layer are formed near a pair of top corners of the isolation trench.
(h) A fourth dielectric layer is formed on the surface region of the substrate to cover the isolation trench. The fourth dielectric layer is contacted with the remaining third dielectric layer in the isolation trench.
(i) The fourth dielectric layer is removed to expose the surface region of the substrate, thereby filling the pair of depressions of the remaining third dielectric layer with the remaining fourth dielectric layer.

The remaining third and fourth dielectric layers in the isolation trench constitute a trench isolation structure.

The remaining third dielectric layer in the isolation trench serves as a primary insulator of the trench isolation structure, and the remaining fourth isolation dielectric in the isolation trench serves as a secondary insulator thereof.

(j) An interlayer dielectric layer is formed on the surface region of the substrate to cover the isolation trench.
(k) A contact hole is formed in the interlayer dielectric layer by etching. The contact hole is located near the isolation trench.
(l) A conductive layer is formed on the interlayer dielectric layer to be overlapped with the isolation trench. The conductive layer is contacted with and electrically connected to a region of the substrate through the contact hole of the interlayer dielectric layer.

The fourth dielectric layer has a lower etch rate than the interlayer dielectric layer in the step (k) of forming the contact hole.

With the fabrication method of a semiconductor device according to the second aspect of the present invention, after the first and second dielectric layers are formed in the surface region of the semiconductor substrate, the isolation trench is formed in the surface region of the substrate. Then, the third dielectric layer is formed on the second dielectric layer and then, is planarized until the underlying second dielectric layer is exposed. Thus, the isolation trench is entirely filled with the remaining third dielectric layer.

Subsequently, after the second dielectric layer is removed, the first dielectric layer is removed to expose the surface region of the substrate while the pair of depressions of the remaining third dielectric layer are formed to have one side contiguous with one of the pair of top corners of the isolation trench.

Further, the pair of depressions of the remaining third dielectric layer are filled with the fourth dielectric layer, thereby constituting the trench isolation structure by the remaining third and fourth dielectric layers in the isolation trench. The fourth dielectric layer has a lower etch rate than the interlayer dielectric layer in the step (k) of forming the contact hole.

Thus, the semiconductor device according to the first aspect is fabricated by the fabrication method according to the second aspect.

In a preferred embodiment of the method according to the second aspect, the third dielectric layer is made of silicon dioxide and the fourth dielectric layer is made of silicon nitride.

In this case, the advantage of the present invention is effectively brought out.

In another preferred embodiment of the method according to the second aspect, the step (e) of planarizing the third dielectric layer is performed by a Chemical/Mechanical Polishing (CMP) process.

In this case, there is an additional advantage that the wanted performance of the step (e) is ensured.

In still another preferred embodiment of the method according to the second aspect, the step (g) of removing the second dielectric layer is performed by a wet etching process.

In this case, there is an additional advantage that the pair of depressions of the remaining third dielectric layer are readily realized.

According to a third aspect of the present invention, another fabrication method of the semiconductor device according to the first aspect is provided, which is comprised of the following steps (a) to (n):

(a) A first dielectric layer is formed on a surface region of a semiconductor substrate.
(b) A second dielectric layer is formed on the first dielectric layer.
(c) An isolation trench is formed in the surface region of the substrate through said first and second dielectric layers.
(d) A third dielectric layer is formed on the second dielectric layer to cover the isolation trench. The isolation trench is partially filled with the third dielectric layer thus formed.
(e) A semiconductor layer is formed on the third dielectric layer to cover the isolation trench. The isolation trench is entirely filled with the third dielectric layer and the semiconductor layer thus formed.
(f) The semiconductor layer is thermally oxidized to form a silicon dioxide layer while a part of the semiconductor layer in the isolation trench is left unoxidized.
(g) The silicon dioxide layer and the third dielectric layer are planarized until the underlying second dielectric layer is exposed. The isolation trench is entirely filled with the remaining third dielectric layer, the remaining semiconductor layer, and the remaining silicon oxide layer.
(h) The silicon dioxide layer and the third dielectric layer are removed without removing the second dielectric layer, the remaining third dielectric layer, the remaining semiconductor layer, and the remaining silicon dioxide layer.
(i) The second dielectric layer is removed to expose the surface region of the substrate while a pair of depressions of the remaining third dielectric layer are formed to have one side contiguous with one of a pair of top corners of the isolation trench.
(j) A fourth dielectric layer is formed on the surface region of the substrate to cover the isolation trench. The fourth dielectric layer is contacted with the remaining third dielectric layer and the remaining silicon dioxide layer in the isolation trench.
(k) The fourth dielectric layer is removed to expose the surface region of the substrate, thereby filling the pair of depressions of the remaining third dielectric layer with the remaining fourth dielectric layer.

The remaining third and fourth dielectric layers and the remaining silicon dioxide layer in the isolation trench constitute a trench isolation structure.

The remaining third dielectric layer in the isolation trench serves as a primary insulator of the trench isolation structure, and the remaining fourth isolation dielectric in the isolation trench serves as a secondary insulator thereof.

(l) An interlayer dielectric layer is formed on the surface region of the substrate to cover the isolation trench.
(m) A contact hole is formed in the interlayer dielectric layer by etching. The contact hole is located near the isolation trench.
(n) A conductive layer is formed on the interlayer dielectric layer to be overlapped with the isolation trench. The conductive layer is contacted with and electrically connected to a region of the substrate through the contact hole of the interlayer dielectric layer.

The fourth dielectric layer has a lower etch rate than the interlayer dielectric layer in the step (m) of forming the contact hole.

With the fabrication method of a semiconductor device according to the third aspect of the present invention, substantially the same steps as those of the fabrication method according to the second aspect are performed except that the step (e) of forming the semiconductor layer is added. Therefore, the semiconductor device according to the first aspect which has the buried semiconductor is fabricated.

In a preferred embodiment of the method according to the third aspect, the third dielectric layer is made of silicon dioxide and the fourth dielectric layer is made of silicon nitride.

In this case, the advantage of the present invention is effectively brought out.

In another preferred embodiment of the method according to the third aspect, the step (g) of planarizing the silicon dioxide layer and the third dielectric layer is performed by a CMP process.

In this case, there is an additional advantage that, the wanted performance of the step (e) is ensured.

In still another preferred embodiment of the method according to the third aspect, the step (g) of planarizing the silicon dioxide layer and the third dielectric layer is performed by an etching process using a resist formed on the silicon dioxide layer.

In this case, there is an additional advantage that the wanted performance of the step (e) is ensured.

As the semiconductor layer, silicon is preferably used.

In a further preferred embodiment of the method according to the third aspect, the step (i) of removing the second dielectric layer is performed by a wet etching process.

In this case, there is an additional advantage that the pair of depressions of the remaining third dielectric layer are readily realized.

BRIEF DESCRIPTION OF THE DRAWINGS

In order that the present invention maybe readily carried into effect, it will now be described with reference to the accompanying drawings.

DETAILED DESCRIPTION OF THE PREFERRED EMBODIMENTS

Figure 1:
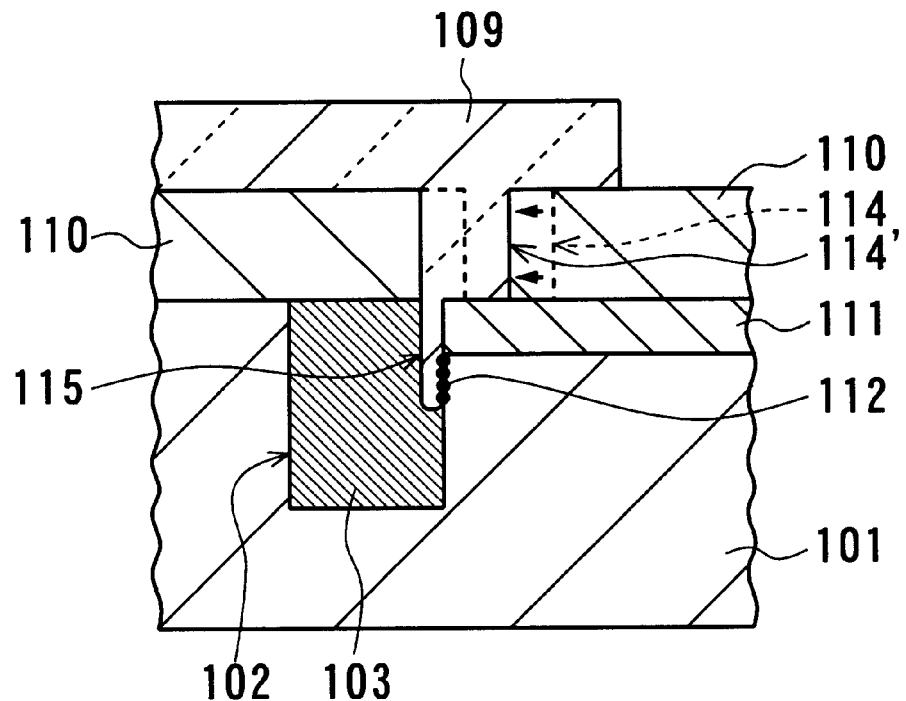
FIG. 1 is a partial, cross-sectional view of a conventional semiconductor device, which shows a cause of current leakage in the trench isolation structure.
Figure 2:
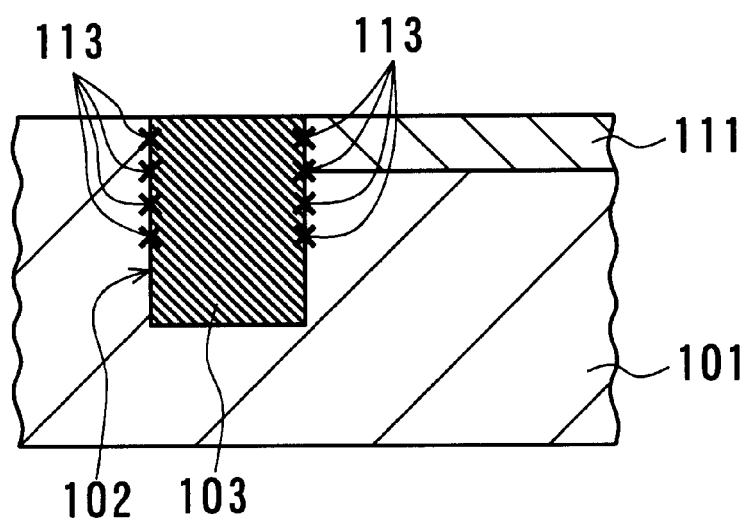
FIG. 2 is a partial, cross-sectional view of a conventional semiconductor device, which shows another cause of current leakage in the trench isolation structure.

Preferred embodiments of the present invention will be described in detail below while referring to the drawings attached.

FIRST EMBODIMENT

Figure 3:
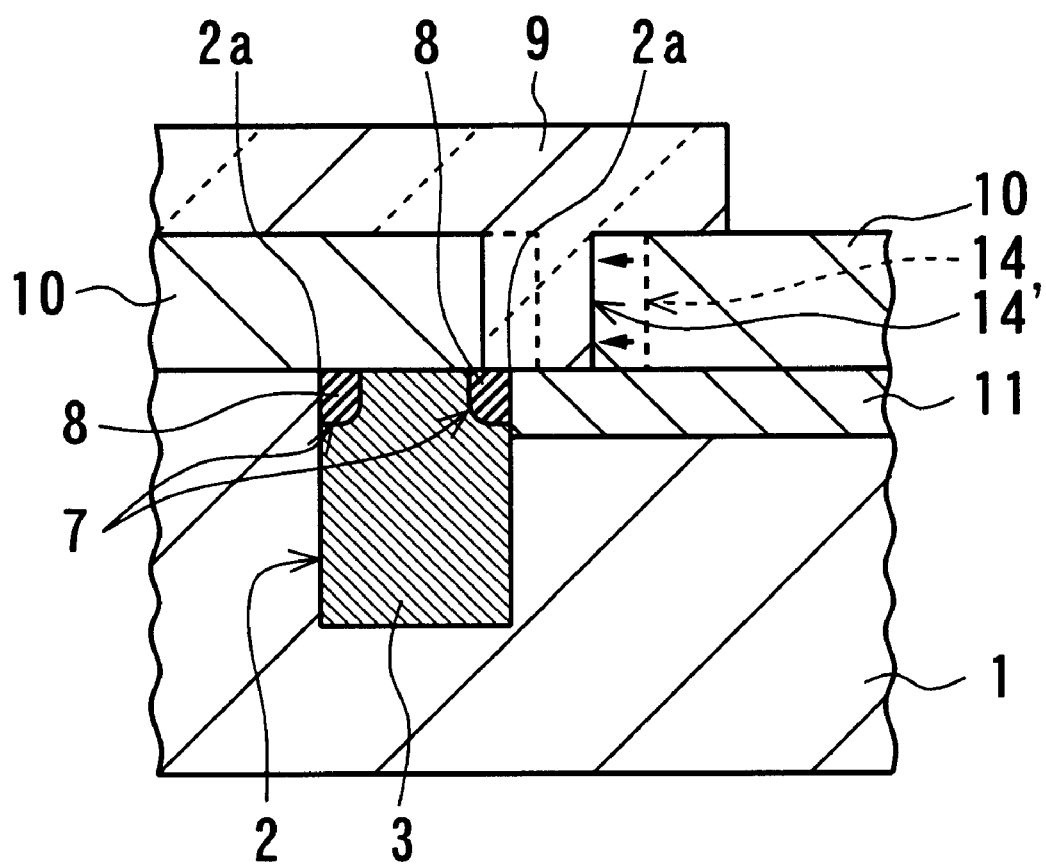
FIG. 3 is a partial, cross-sectional view of a semiconductor device with the trench isolation structure according to a first embodiment of the present invention.

FIG. 3 shows a semiconductor device with the trench isolation structure according to a first embodiment of the present invention.

In FIG. 3, an isolation trench 2 with a rectangular cross section is formed in a surface region of a single-crystal silicon substrate 1. The trench 2, which extends along the main surface of the substrate 1 to define active regions, has a width of 0.3 μm and a depth of 0.5 μm.

The trench 2 is filled with two different isolation dielectrics 3 and 8. The isolation dielectric 3 has a pair of depressions 7 each with one side contiguous with one of the pair of top corners 2a of the isolation trench 2. The pair of depressions 7 extend along the pair of top corners 2a and they are filled with the isolation dielectric 8. Here, the isolation dielectrics 3 and 8 are made of $SiO_2$ and $SiN_x$, respectively.

A diffusion region 11, which is opposite in conductivity type to the substrate 1, is formed in the surface region of the substrate 1. The end of the diffusion region 11 is contacted with the opposing edge of the isolation trench 2.

An interlayer insulating layer 10 is formed on the surface region of the substrate 1 to cover the diffusion region 11 and the isolation dielectrics 3 and 8. The interlayer insulating layer 10 has a contact hole 14' uncovering the diffusion region 11. Here, the interlayer insulating layer 10 is made of $SiO_2$.

A metallic wiring layer 9 is formed on the interlayer insulating layer 10 to overlap with the diffusion region 11 and the isolation trench 2. The wiring layer 9 is contacted with and electrically connected to the underlying diffusion region 11 through the contact hole 14' of the interlayer insulating layer 10.

The position of the contact hole 14' is designed so that the contact hole 14' uncovers the diffusion region 11 alone, in other words, the contact hole 14' is not contacted with the isolation dielectrics 3 and 8. The designed, correct position of the contact hole 14' is indicated by a reference numeral 14 in FIG. 3.

With the semiconductor device according to the first embodiment, the isolation trench 2 formed in the surface region of the semiconductor substrate 1 is filled with the isolation dielectric ($SiO_2$) 3 and the isolation dielectrics ($SiN_x$) 8, where the isolation dielectric 3 serves as a primary insulator, and the isolation dielectric 8 serves as a secondary insulator.

Also, the pair of depressions 7 of the isolation dielectric ($SiO_2$) 3, which are located near the pair of top corners 2a of the isolation trench 2, are filled with the isolation dielectric ($SiN_x$) 8.

Therefore, when the position of the contact hole 14' of the interlayer dielectric layer 10 deviates from its correct position 14 due to the positional and/or dimensional fluctuation in the fabrication process sequence and consequently, the contact hole 14' is overlapped with the isolation trench 2, the etching action is applied to the isolation dielectric ($SiN_x$) 8 in the isolation trench 2 during the etching process for forming the contact hole 14' of the interlayer dielectric layer ($SiO_2$) 10.

Because the second dielectric ($SiN_x$) 8 has a lower etch rate than that of the interlayer dielectric layer ($SiO_2$) 10 in the etching process for forming the contact hole 14' of the interlayer dielectric layer ($SiO_2$) 10, the second dielectric 8 is difficult to be etched.

Thus, the above-described leakage current problem due to etching is prevented from occurring.

Additionally, the isolation trench 2 is filled with the isolation dielectric ($SiO_2$) 3 serving as a primary insulator and the isolation dielectric ($SiN_x$) 8 serving as a secondary insulator. Therefore, almost all the trench 2 is filled with the isolation dielectric ($SiO_2$) 3 having a small stress and a small part of the trench 2 is filled with the isolation dielectric ($SiN_x$) 8 having a large stress. Thus, no crystal defect is generated at the contact area of the isolation dielectric ($SiN_x$) 8 with the substrate 1 even after heat treatment.

As a result, the above-described leakage current problem due to crystal defect is prevented from occurring.

The width of the pair of depressions 7 of the isolation dielectric ($SiO_2$) 3 is determined to accord with the positional and/or dimensional fluctuation in the fabrication process sequence.

Next, a fabrication method of the semiconductor device according to the first embodiment of FIG. 3 is explained below reference to FIGS. 4A to 4G.

First, a pad $SiO_2$ layer 5 with a thickness of 10 nm is formed on the surface region of the semiconductor substrate 1. Then, a pad $SiN_x$ layer 6 with a thickness of 30 nm is formed on the pad $SiO_2$ layer 5.

Figure 4A:
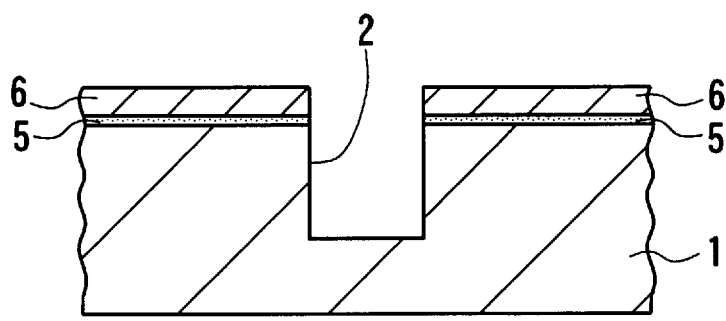
FIGS. 4A to 4G are partial, cross-sectional views showing a fabrication method of the semiconductor device according to the first embodiment of FIG. 3, respectively.

The isolation trench 2 with a width of 0.3 μm and a depth of 0.5 μm is then formed in the surface region of the substrate 1 through the pad $SiO_2$ and $SiN_x$ layers 5 and 6 by popular lithography and etching processes, as shown in FIG. 4A.

Figure 4B:
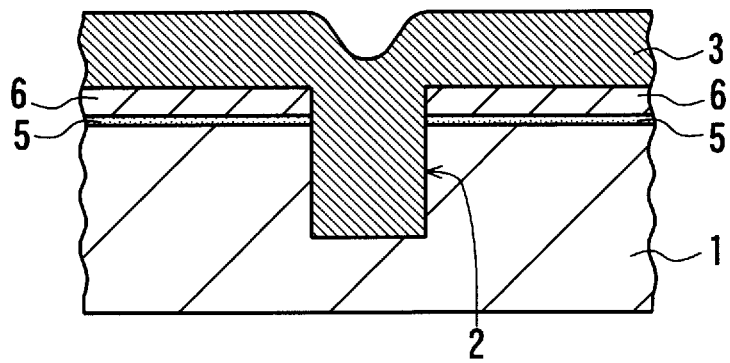

Following this, a $SiO_2$ layer 3 with a thickness of 0.2 μm is deposited on the pad $SiN_x$ layer 6 to cover the isolation trench 2 by a Chemical Vapor Deposition (CVD) process. The isolation trench 2 is entirely filled with the $SiO_2$ layer 3 thus deposited, as shown in FIG. 4B.

Figure 4C:
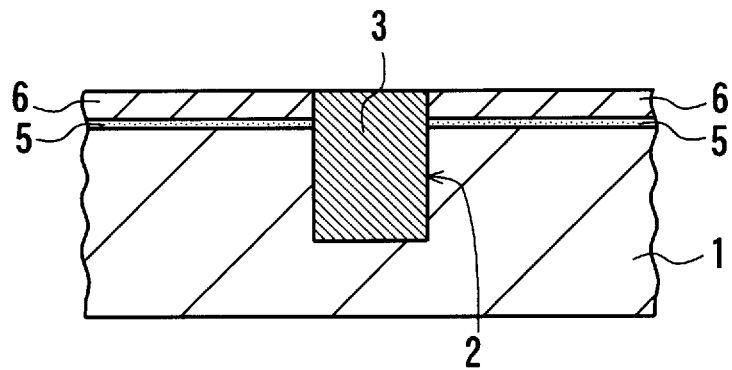

The pad $SiO_2$ layer 3 is then polished by a CMP process until the underlying pad $SiN_x$ layer 6 is exposed. The polished thickness of the pad $SiO_2$ layers 3 is set as 0.15 μm. Thus, as shown in FIG. 4C, the surface of the remaining pad $SiN_x$ layer 6 is planarized while the isolation trench 2 is entirely filled with the remaining $SiO_2$ layer 3.

Because the condition of this CMP process is optimized for the $SiO_2$ layer 3, the $SiN_x$ layer 6 is scarcely polished. For example, if the CMP process is performed using popular colloidal silica, an obtainable selectivity for $SiO_2$ with respect to $SiN_x$ becomes approximately 10 times.

Figure 4D:
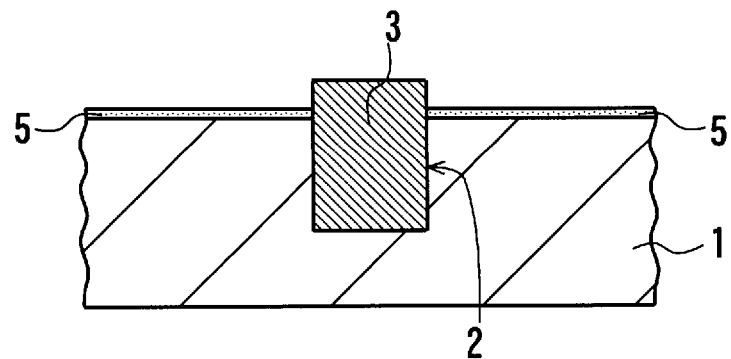
Figure 4E:
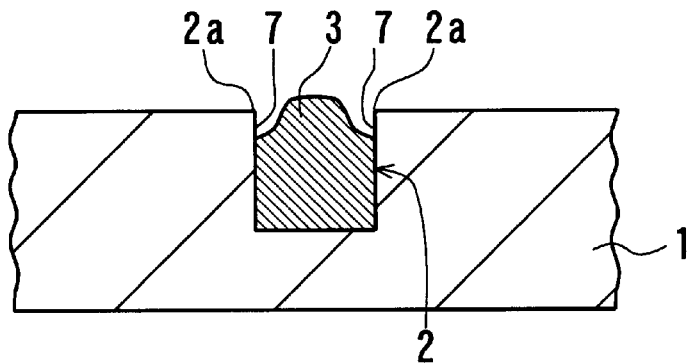

Further, the remaining pad $SiN_x$ layer 6 is removed by a wet etching process using a hot water solution of phosphoric acid. During this process, the pad $SiO_2$ layer 5 and the remaining $SiO_2$ layer 3 in the trench 2 are not etched. The state at this stage is shown in FIG. 4D. At this stage, the top of the remaining $SiO_2$ layer 3 in the trench 2 is protruded from pad $SiO_2$ layer 5.

The pad $SiO_2$ layer 5 is then removed to expose the surface region of the substrate 1 by a wet etching process using a diluted water solution of phosphoric acid. During this process, the pad $SiO_2$ layer 5 is entirely etched and at the same time, the remaining $SiO_2$ layer 3 in the trench 2 is partially etched, resulting in the pair of depressions 7 on the remaining $SiO_2$ layer 3. The pair of depressions 7, which have a depth of approximately 0.03 μm, each has one side contiguous with one of the pair of top corners 2a of the isolation trench 2.

Figure 4F:
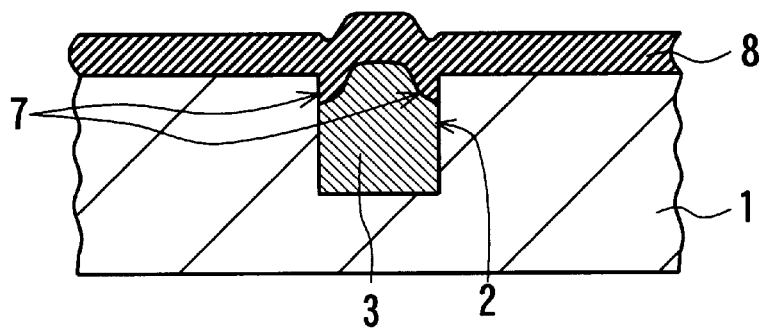

Subsequently, a $SiN_x$ layer 8 with a thickness of 0.06 μm is deposited by a CVD process on the surface region of the substrate 1 to cover the isolation trench 2, as shown in FIG. 4F. The $SiN_x$ layer 8 is contacted with the remaining $SiO_2$ layer 3 in the isolation trench 2. The pair of depressions 7 are filled with the $SiN_x$ layer 8.

Figure 4G:
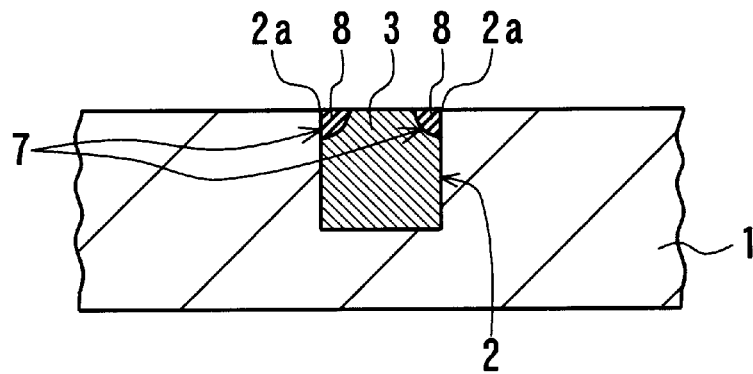

The $SiN_x$ layer 8 is then removed by a dry etching process such as a plasma-assisted etching process to expose the surface region of the substrate 1. Thus, the pair of depressions 7 of the remaining $SiO_2$ layer 3, each having one side contiguous with one of near the pair of top corners 2a of the isolation trench 2, are filled with the remaining $SiN_x$ layer 8, as shown in FIG. 4G.

The remaining $SiO_2$ and $SiN_x$ layers 3 and 8 in the isolation trench 2 constitute the trench isolation structure.

The remaining $SiO_2$ layer 3 in the isolation trench 2 serves as a primary insulator of the trench isolation structure, and the remaining $SiN_x$ layer 8 in the isolation trench 2 serves as a secondary insulator thereof.

Following this, the interlayer dielectric layer ($SiO_2$) 10 is formed on the surface region of the substrate 1 to cover the isolation trench 2 by a popular process.

The contact hole 14' is then formed in the interlayer dielectric layer ($SiO_2$)10 by a dry etching process using a $CF_x$ gas as an etchant. In this etching process, the $SiN_x$ layer 8 has a lower etch rate than that of the interlayer dielectric layer ($SiO_2$) 10. The contact hole 14' is located near the isolation trench 2.

Figure 7:
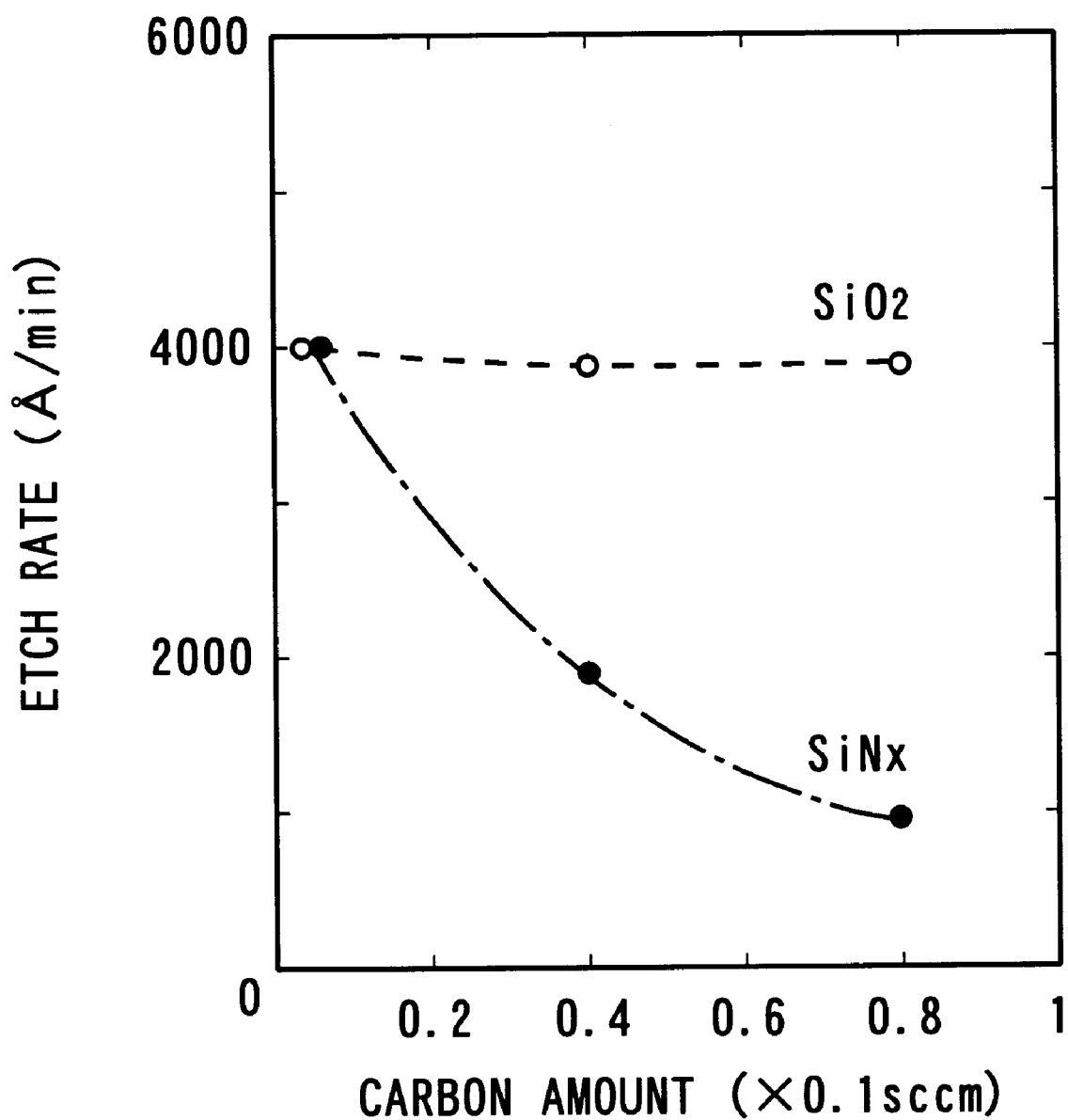
FIG. 7 is a graph showing the relationship between the etch rate for $SiO_2$ and $SiN_x$ and the carbon amount in the dry etching process using a $CF_x$ gas.

FIG. 7 shows the relationship between the etch rate for $SiO_2$ and $SiN_x$ and the carbon amount in the dry etching process using a $CF_x$ gas as an etchant, which was made based on the result the inventors' testing.

As seen from FIG. 7, when carbon fluoride ($CF_x$) is used as an etching gas, the etch rates for $SiO_2$ and $SiN_x$ are changed according to the carbon amount of $CF_x$. Specifically, the etch rate for $SiO_2$ varies within a narrow range (i.e., approximately constant) even if the carbon amount of $CF_x$ is changed. On the other hand, the etch rate for $SiN_x$ decreases monotonously as the carbon amount of $CF_x$ is increased. This etch rate difference for $SiO_2$ and $SiN_x$ is applied to the etching process of the contact hole 14'.

Although not shown in FIG. 7, the result of the inventors' testing showed that the etch rate for $SiO_2$ may become about ten times as much as that for $SiN_x$ when carbon fluoride ($CF_x$) is used as an etching gas.

Accordingly, if the position of the contact hole 14' deviates from its correct position 14 and as a result, the wiring layer 9 on the interlayer insulating layer 10 is contacted with the isolation trench 2 through the contact hole 14' of the interlayer insulating layer 10, the etching action is affected to the $SiN_x$ layer 8 with a lower etch rate than the $SiO_2$ layer 10, as shown in FIG. 3.

Following this process, the metallic wiring layer 9 is formed on the interlayer dielectric layer 10 to be overlapped with the isolation trench 2 by popular metal deposition and patterning processes. The wiring layer 9 is contacted with and electrically connected to a diffusion region 11 of the substrate 1 through the contact hole 14' of the interlayer dielectric layer 10.

Thus, the semiconductor device with the trench isolation structure according to the first embodiment of FIG. 3 is fabricated.

SECOND EMBODIMENT

A semiconductor device with the trench isolation structure according to a second embodiment the present invention is fabricated in the following way.

Figure 5A:
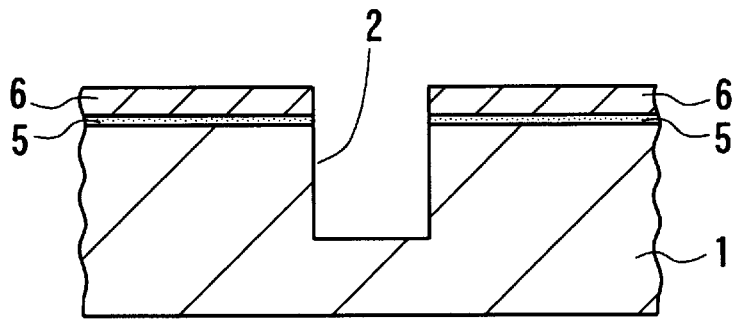
FIGS. 5A to 5H are partial, cross-sectional views showing a fabrication method of a semiconductor device according to a second embodiment, respectively.

First, the state shown in FIG. 5A is fabricated in the same process steps as those in the first embodiment.

Specifically, the pad $SiO_2$ layer 5 with a thickness of 7 nm is formed on the surface region of the semiconductor substrate 1. Then, the pad $SiN_x$ layer 6 with a thickness of 20 nm is formed on the pad $SiO_2$ layer 5.

The isolation trench 2 with a width of 0.2 μm and a depth of 0.4 μm is then formed in the surface region of the substrate 1 through the pad $SiO_2$ and $SiN_x$ layers 5 and 6 by popular lithography and etching processes, as shown in FIG. 5A.

Figure 5B:
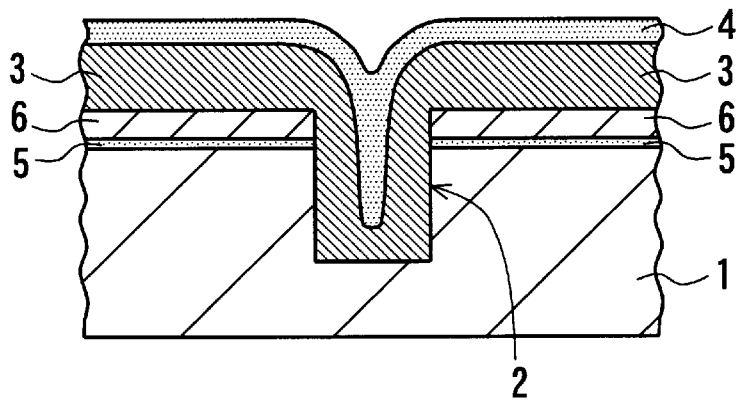

Subsequently, the $SiO_2$ layer 3 with a thickness of 0.15 μm is deposited on the pad $SiN_x$ layer 6 to cover the isolation trench 2 by a CVD process. The isolation trench 2 is partially filled with the $SiO_2$ layer 3 thus deposited, as shown in FIG. 5B.

Figure 5C:
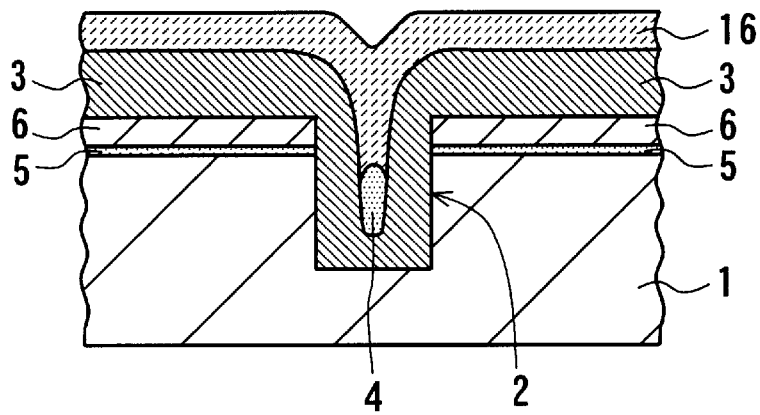

A polysilicon layer 4 with a thickness of 0.05 μm is deposited on the $SiO_2$ layer 3 by a CVD process. The polysilicon layer 4 is subjected to a heat-treatment for oxidation at a temperature of 900° C., resulting in a $SiO_2$ layer 16. During this process, a part of the polysilicon layer 4 in the trench 2 is not oxidized. The state at this stage is shown in FIG. 5C.

The following steps are substantially the same as those of the first embodiment.

Figure 5D:
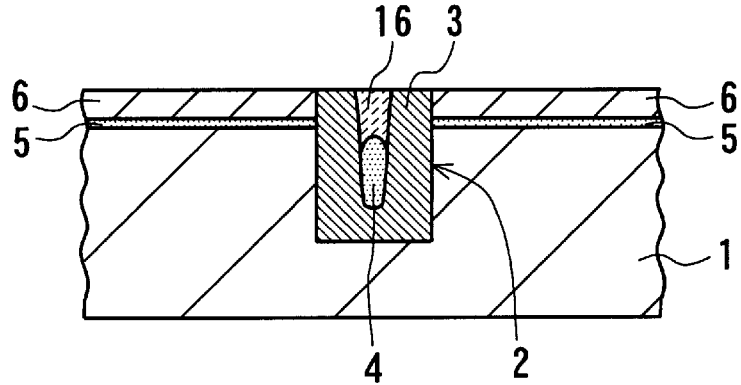

Specifically, the $SiO_2$ layers 3 and 16 and the remaining polysilicon layer 4 are then polished by a CMP process until the underlying pad $SiN_x$ layer 6 is exposed. The condition of this CMP process is optimized for the $SiO_2$ layers 3 and 16. The polished thickness the $SiO_2$ layer 3 is set as 0.15 μm. Thus, as shown in FIG. 5D, the surface of the remaining pad $SiN_x$ layer 6 is planarized while the isolation trench 2 is entirely filled with the remaining $SiO_2$ layers 3 and 16 and the remaining polysilicon layer 4. At this stage, the isolation trench 2 is entirely filled with the remaining $SiO_2$ layers 3 and 16 and the remaining polysilicon layer 4, as shown in FIG. 5D.

Figure 5E:
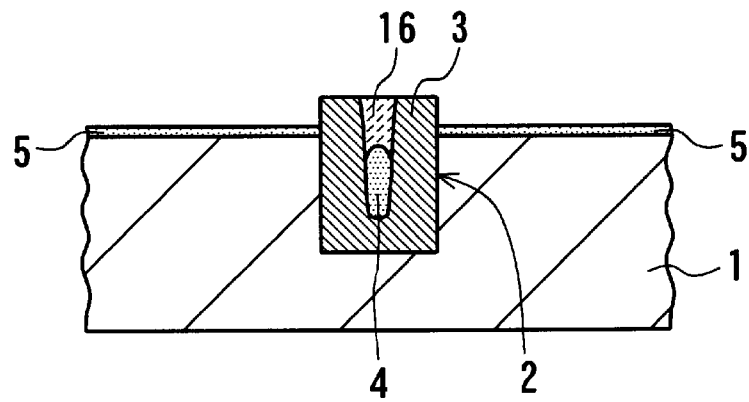

Further, the remaining pad $SiN_x$ layer 6 is removed by a wet etching process using a hot water solution of phosphoric acid. During this process, the remaining pad $SiO_2$ layer 5 and the remaining $SiO_2$ layers 3 and 16 in the trench 2 are not etched. The state at this stage is shown in FIG. 5E. At this stage, the tops of the remaining $SiO_2$ layers 3 and 16 in the trench 2 are protruded from the pad $SiO_2$ layer 5.

Figure 5F:
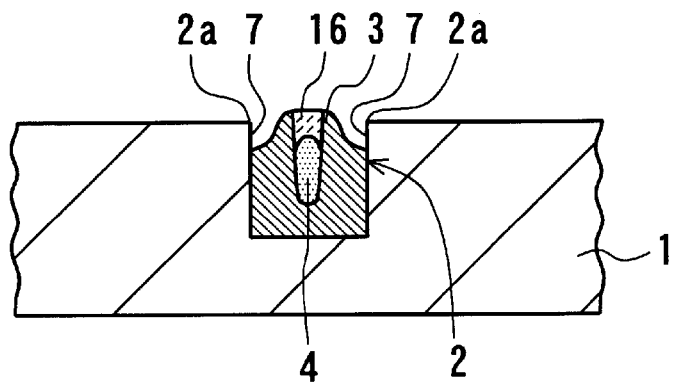

The pad $SiO_2$ layer 5 is then removed to expose the surface region of the substrate 1 by a wet etching process using a diluted water solution of phosphoric acid. During this process, the remaining $SiO_2$ layers 3 and 16 are partially etched, resulting in the pair of depressions 7 on the remaining $SiO_2$ layer 3, as shown in FIG. 5F. The pair of depressions 7, which have a depth of approximately 0.02 μm, each have one side contiguous with one of the pair of top corners 2a of the isolation trench 2.

Figure 5G:
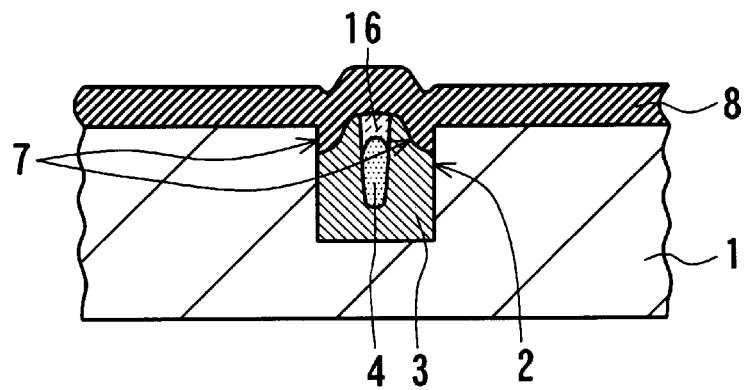

Subsequently, the $SiN_x$ layer 8 with a thickness of 0.04 μm is deposited by a CVD process on the surface region of the substrate 1 to cover the isolation trench 2, as shown in FIG. 5G. The $SiN_x$ layer 8 is contacted with the remaining $SiO_2$ layers 3 and 16 and the remaining polysilicon layer 4 in the isolation trench 2. The pair of depressions 7 are filled with the remaining $SiN_x$ layer 8.

Figure 5H:
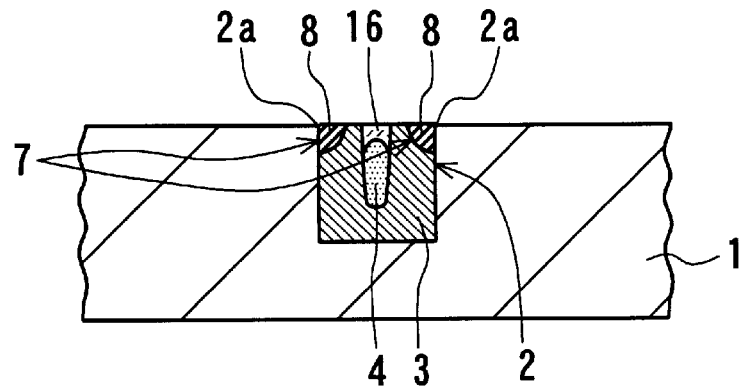

Following this, the $SiN_x$ layer 8 is removed by a dry etching process such as a plasma-assisted etching process to expose the surface region of the substrate 1. Thus, the pair of depressions 7 of the remaining $SiO_2$ layer 3, each having one side contiguous with one of the pair of top corners 2a of the isolation trench 2, are filled with the remaining $SiN_x$ layer 8, as shown in FIG. 5H.

The remaining $SiO_2$ layers 3 and 16, the remaining $SiN_x$ layer 8, and the remaining polysilicon layer 4 in the isolation trench 2 constitute the trench isolation structure.

The remaining $SiO_2$ layers 3 and 16 in the isolation trench 2 serve as a primary insulator of the trench isolation structure, and the remaining $SiN_x$ layer 8 in the isolation trench 2 serves as a secondary insulator thereof.

The following process steps are the same as those of the first embodiment and therefore, the explanation is omitted here.

Thus, the semiconductor device with the trench isolation structure according to the second embodiment is fabricated.

With the semiconductor device according to the second embodiment, unlike the first embodiment shown in FIG. 3, the polysilicon layer 4 is buried in the $SiO_2$ layer 3 in the trench 2, as shown in FIG. 5H.

Consequently, there is an additional advantage that the stress of the $SiO_2$ layer 3 is decreased compared with the case where the buried polysilicon layer 4 is not formed, thereby decreasing the danger of the crystal defect regions after heat treatment.

THIRD EMBODIMENT

A fabrication method of a semiconductor device with the trench isolation structure according to a third embodiment is explained below. This method is a variation of the method according to the second embodiment.

Figure 6A:
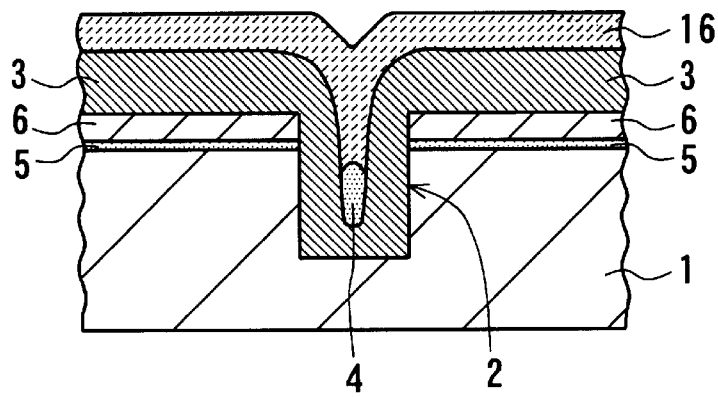
FIGS. 6A to 6D are partial, cross-sectional views showing a fabrication method of a semiconductor device according to a third embodiment, respectively.

First, the state shown in FIG. 6A is fabricated in the same process steps as those in the second embodiment.

Specifically, the pad $SiO_2$ layer 5 with a thickness of 10 nm is formed on the surface region of the semiconductor substrate 1. Then, the pad $SiN_x$ layer 6 with a thickness of 40 nm is formed on the pad $SiO_2$ layer 5.

The isolation trench 2 with a width of 0.4 μm and a depth of 0.5 μm is then formed in the surface region of the substrate 1 through the pad $SiO_2$ and $SiN_x$ layers 5 and 6 by popular lithography and etching processes, as shown in FIG. 6A.

Subsequently, the $SiO_2$ layer 3 with a thickness of 0.15 μm is deposited on the pad $SiN_x$ layer 6 to cover the isolation trench 2 by a CVD process. The isolation trench 2 is partially filled with the $SiO_2$ layer 3 thus deposited, as shown in FIG. 6A.

A polysilicon layer 4 with a thickness of 0.05 μm is deposited on the $SiO_2$ layer 3 by a CVD process. The polysilicon layer 4 is subjected to a heat treatment for oxidation at a temperature of 900° C., resulting in a $SiO_2$ layer 16. During this process, a part of the polysilicon layer 4 in the trench 2 is not oxidized. The state at this stage is shown in FIG. 6A.

Figure 6B:
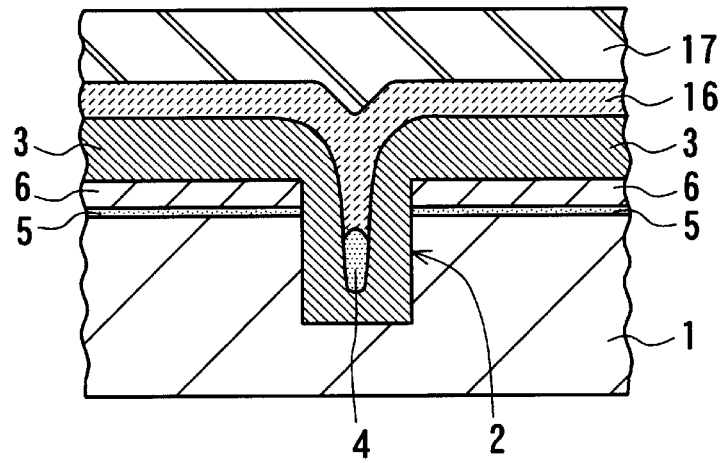

Next, a photoresist film 17 with a thickness of 50 nm is formed on the $SiO_2$ layer 16, as shown in FIG. 6B. The photoresist film 17 needs to have a flat surface to realize substantially the same effect as that of the CMP process in the second embodiment.

Figure 6C:
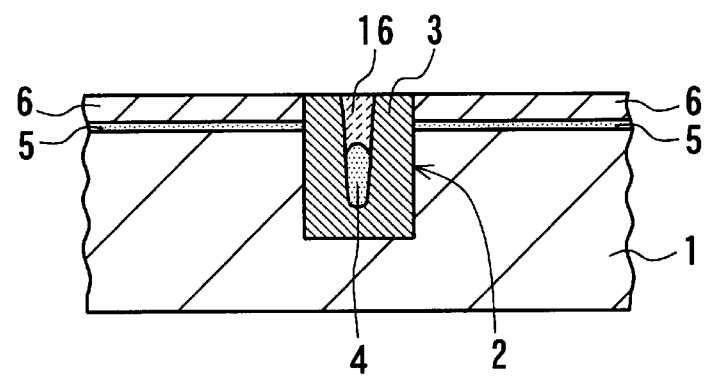

Then, instead of the CMP process in the second embodiment, the photoresist film 17 and the underlying $SiO_2$ layers 3 and 16 are etched back by a dry etching process until the underlying pad $SiN_x$ layer 6 is exposed, as shown in FIG. 6C. In this etch back process, an etchant is selected so that the photoresist film 17 and the $SiO_2$ layers 3 and 16 have substantially the same etch rate. Therefore, the isolation trench 2 is entirely filled with the remaining $SiO_2$ layers 3 and 16 and the remaining polysilicon layer 4, as shown in FIG. 6C.

Because the etching condition of this etch back process is optimized for the $SiO_2$ layers 3 and 16, the $SiN_x$ layer 6 is scarcely polished during this process. For example, if this etch back process is performed using a carbon tetrafluoride ($CF_4$) gas, an obtainable selectivity for $SiO_2$ with respect to $SiN_x$ becomes approximately 10 times.

The subsequent process steps are the same as those in the second embodiment.

Specifically, the remaining pad $SiN_x$ layer 6 is removed by a wet etching process using a hot water solution of phosphoric acid. During this process, the remaining pad $SiO_2$ layer 5 and the remaining $SiO_2$ layers 3 and 16 in the trench 2 are not etched. At this stage, the tops of the remaining $SiO_2$ layers 3 and 16 in the trench 2 are protruded from the pad $SiO_2$ layer 5.

Figure 6D:
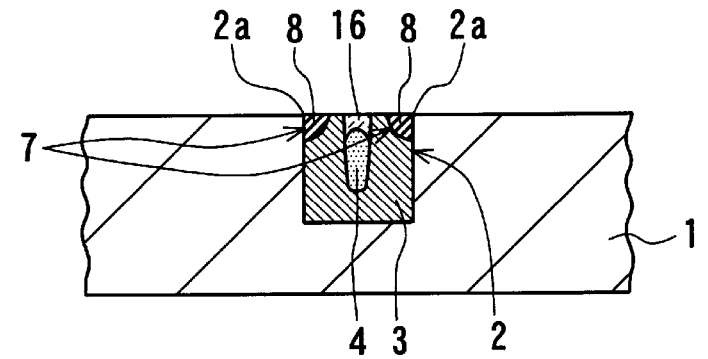

The pad $SiO_2$ layer 5 is then removed to expose the surface region of the substrate 1 by a wet etching process using a diluted water solution of phosphoric acid. During this process, the remaining $SiO_2$ layers 3 and 16 are partially etched, resulting in the pair of depressions 7 on the remaining $SiO_2$ layer 3, as shown in FIG. 6D. The pair of depressions 7, which have a depth of approximately 0.05 μm, each have one side contiguous with one of the pair of top corners 2a of the isolation trench 2.

Subsequently, the $SiN_x$ layer 8 with a thickness of 0.08 μm is deposited by a CVD process on the surface region of the substrate 1 to cover the isolation trench 2. The $SiN_x$ layer 8 is contacted with the remaining $SiO_2$ layers 3 and 16 and the remaining polysilicon layer 4 in the isolation trench 2. The pair of depressions 7 are filled with the remaining $SiN_x$ layer 8.

Following this, the $SiN_x$ layer 8 is removed by a dry etching process such as a plasma-assisted etching process to expose the surface region of the substrate 1. Thus, the pair of depressions 7 of the remaining $SiO_2$ layer 3, each have one side contiguous with of the pair of top corners 2a of the isolation trench 2, are filled with the remaining $SiN_x$ layer 8, as shown in FIG. 6D.

Thus, the trench isolation structure is fabricated. This structure has a same configuration as that according to the second embodiment shown in FIG. 5H.

The following process steps are the same as those of the first embodiment and therefore, the explanation is omitted here.

There is an additional advantage that no CMP process is required for realizing the state of FIG. 6C.

In the above-described first to third embodiments, $SiO_2$ and $SiN_x$ are used as the dielectric. However it is needless to say that any other dielectric than $SiO_2$ and $SiN_x$ may used in the present invention.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A semiconductor device comprising:

a semiconductor substrate;

an isolation trench formed in a surface region of said substrate and filled with first and second isolation dielectrics;

an interlayer dielectric layer formed on said surface region of said substrate to cover said isolation trench;

a conductive layer formed on said interlayer dielectric layer to be overlapped with said isolation trench;

said interlayer dielectric layer having a contact hole located near said isolation trench;

said contact hole being formed by an etching process;

said conductive layer being contacted with and electrically connected to a region of said substrate through said contact hole of said interlayer dielectric layer;

said first isolation dielectric serving as a primary insulator, and said second isolation dielectric serving as a secondary insulator;

said first isolation dielectric having a pair of depressions, each of said depressions having one side contiguous with one of a pair of top corners of said isolation trench;

said pair of depressions of said first isolation dielectric being filled with said second isolation dielectric; and said second dielectric having a lower etch rate in said etching process for forming said contact hole than that of said first dielectric.

2. A device as claimed in claim 1, wherein said first isolation dielectric is made of silicon dioxide and said second isolation dielectric is made of silicon nitride.

3. A device as claimed in claim 1, wherein said first isolation dielectric includes a buried semiconductor;

said buried semiconductor is not exposed from said first isolation dielectric.

4. A device as claimed in claim 3, wherein said buried semiconductor is silicon.

5. A semiconductor device comprising:

a semiconductor substrate;

an isolation trench formed in a surface region of said substrate and filled with first and second isolation dielectrics;

an interlayer dielectric layer formed on said surface region of said substrate to cover said isolation trench;

a conductive layer formed on said interlayer dielectric layer to be overlapped with said isolation trench;

said interlayer dielectric layer having a contact hole located near said isolation trench;

said contact hole being formed by an etching process;

said conductive layer being contacted with and electrically connected to a region of said substrate through said contact hole of said interlayer dielectric layer;

said first isolation dielectric includes a buried semiconductors;

said buried semiconductor is not exposed from said first isolation dielectric;

said first isolation dielectric serving as a primary insulator, and said second isolation dielectric serving as a secondary insulator;

said first isolation dielectric having a pair of depressions located near, each of said depressions having one side contiguous with one of a pair of top corners of said isolation trench;

said pair of depressions of said first isolation dielectric being filled with said second isolation dielectric; and said second dielectric having a lower etch rate in said etching process for forming said contact hole than that of said first dielectric.

* * * * *

UNITED STATES PATENT AND TRADEMARK OFFICE
CERTIFICATE OF CORRECTION

PATENT NO.    : 5,929,504
DATED         : July 27, 1999
INVENTOR(S)   : Toru MOGAMI and Takashi OGURA It is certified that error(s) appears in the above-identified patent and that said Letters Patent is hereby corrected as shown below:

Column 13, line 24, delete "comers" and insert --corners--;

Column 14, line 28, delete "comers" and insert --corners--.

Signed and Sealed this

Eighth Day of February, 2000

Attest:

Attesting Officer

Q. TODD DICKINSON

Commissioner of Patents and Trademarks